(12) United States Patent
Bicksler et al.

(10) Patent No.: US 8,716,084 B2
(45) Date of Patent: May 6, 2014

(54) MEMORY ARRAY WITH AN AIR GAP BETWEEN MEMORY CELLS AND THE FORMATION THEREOF

(71) Applicant: Micron Technology, Inc., Boise, ID (US)

(72) Inventors: Andrew Bicksler, Nampa, ID (US); Christopher J. Larsen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/902,052

(22) Filed: May 24, 2013

(65) Prior Publication Data

US 2013/0260521 A1 Oct. 3, 2013

Related U.S. Application Data

(62) Division of application No. 12/862,107, filed on Aug. 24, 2010, now Pat. No. 8,450,789.

(51) Int. Cl.
*H01L 21/336* (2006.01)
*H01L 29/66* (2006.01)

(52) U.S. Cl.
CPC .............................. *H01L 29/66825* (2013.01)
USPC ............................................ 438/257; 257/315

(58) Field of Classification Search
CPC .................................................. H01L 29/66825
USPC .......................................... 438/257; 257/315
See application file for complete search history.

(56) References Cited

U.S. PATENT DOCUMENTS 6,406,975 B1 6/2002 Lim et al.
6,492,245 B1 12/2002 Liu et al.
(Continued)

FOREIGN PATENT DOCUMENTS

KR 20040070799 11/2004
KR 20050011498 1/2005
(Continued)

OTHER PUBLICATIONS

E. Kunnen, et al., "Introduction of Airgap Deeptrench Isolation in STI Module for High Sped SiGe: C BiCMOS Technology," MRS Materials Research Society http://www.mrs.org/s_subscribe.asp?CID=6469&DID=177599&action=details&css=print (1 page).

(Continued)

*Primary Examiner* — Phat X Cao
(74) *Attorney, Agent, or Firm* — Leffert Jay & Polglaze, P.A.

(57) ABSTRACT

A method of forming a memory array includes forming a dielectric over a semiconductor, forming a charge-storage structure over the dielectric, forming an isolation region through the dielectric and the charge-storage structure and extending into the semiconductor, recessing the isolation region to a level below a level of an upper surface of the dielectric and at or above a level of an upper surface of the semiconductor, forming an access line over the charge-storage structure and the recessed isolation region, and forming an air gap over the recessed isolation region so that the air gap passes through the charge-storage structure, so that the air gap extends to and terminates at a bottom surface of the access line, and so that the entire air gap is between the bottom surface of the access line and the upper surface of the semiconductor.

24 Claims, 6 Drawing Sheets

(56) References Cited

U.S. PATENT DOCUMENTS

| | | |
|---|---|---|
| 6,613,652 B2 | 9/2003 | Lim et al. |
| 6,727,157 B2 | 4/2004 | Seo |
| 7,229,894 B2 | 6/2007 | Koh |
| 7,400,024 B2 | 7/2008 | Kunnen |
| 7,670,924 B2 | 3/2010 | Demos et al. |
| 7,855,123 B2 | 12/2010 | Lee et al. |
| 8,022,464 B2 | 9/2011 | Sato et al. |
| 2002/0094651 A1 | 7/2002 | Farrar |
| 2004/0152278 A1 | 8/2004 | Farrar |
| 2006/0240619 A1 | 10/2006 | Ozawa et al. |
| 2008/0124917 A1 | 5/2008 | Oh et al. |
| 2008/0283898 A1 | 11/2008 | Kuniya |
| 2009/0001444 A1* | 1/2009 | Matsuoka et al. ............ 257/316 |
| 2009/0212352 A1 | 8/2009 | Aoyama et al. |
| 2010/0015813 A1 | 1/2010 | McGinnis et al. |
| 2010/0176368 A1 | 7/2010 | Ko et al. |
| 2010/0295113 A1 | 11/2010 | Kang et al. |
| 2011/0303967 A1 | 12/2011 | Harari et al. |
| 2011/0309416 A1 | 12/2011 | Yamashita et al. |
| 2011/0309425 A1 | 12/2011 | Purayath et al. |

FOREIGN PATENT DOCUMENTS

| | | |
|---|---|---|
| KR | 100856614 | 8/2008 |
| TW | 486773 | 5/2002 |
| WO | WO 2011/160001 A1 | 12/2011 |

OTHER PUBLICATIONS

Cheng-Liang Hsieh et al., *Damascene Process for Air-Gap Cu Interconnects Using Sacrificial Layer HSQ*, Solid-State and Integrated Circuit Technology, 2006. ICSICT '06. 8th International Conference, published 2006, pp. 336-338.

Tsukamoto et al., "Advanced Air Gap Process for Multi-Level-Cell Flash Memories Reducing Threshold Voltage Interference and Realizing High Reliability," Japanese Journal of Applied Physics, vol. 46, pp. 2184-2187 (abstract page only), Apr. 24, 2007.

* cited by examiner

US 8,716,084 B2

MEMORY ARRAY WITH AN AIR GAP BETWEEN MEMORY CELLS AND THE FORMATION THEREOF

RELATED APPLICATION

This application is a divisional of U.S. application Ser. No. 12/862,107, titled "MEMORY ARRAY WITH AN AIR GAP BETWEEN MEMORY CELLS AND THE FORMATION THEREOF," filed Aug. 24, 2010 (allowed), which is commonly assigned and incorporated in its entirety herein by reference.

FIELD

The present disclosure relates generally to memories and in particular, in one or more embodiments, the present disclosure relates to memory arrays with air gaps substantially between the memory cells and the formation thereof.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are coupled in parallel with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing the spacing between memory cells that can increase the capacitive coupling (e.g., termed parasitic capacitance) between adjacent memory cells, such as between the memory cells in adjacent columns, e.g., in the word-line direction or the direction diagonal the word-line direction. For example, a capacitive coupling may exist between the charge-storage structure of a memory cell and adjacent memory cells, e.g., that may affect the threshold voltage, and thus the programmed data value, of the memory cell.

For the reasons stated above, and for other reasons stated below which will become apparent to those skilled in the art upon reading and understanding the present specification, there is a need in the art for alternative techniques for reducing the capacitive coupling between adjacent memory cells.

DETAILED DESCRIPTION

Figure 1:
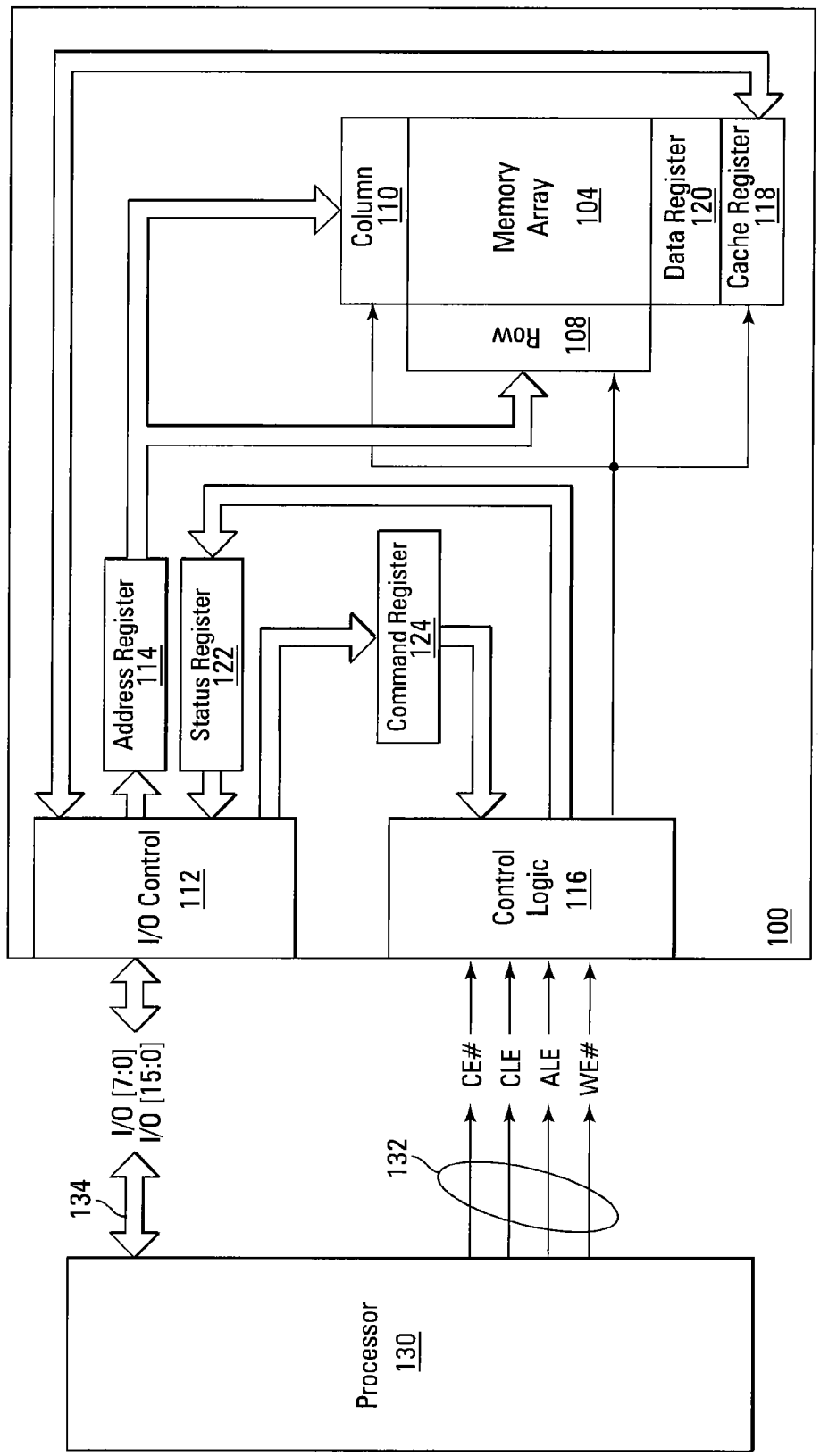
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104, according to embodiments of the disclosure. For example, memory array 104 may include air-containing gaps between adjacent columns of memory cells, e.g., in the data-line (e.g., bit-line) direction, that act to reduce the capacitive coupling between the charge-storage structures of adjacent memory cells. Although these gaps are referred to herein as air-containing gaps, or simply air gaps, it will be understood that the air gaps as defined herein may contain one or more gaseous components other than, or in addition to, ambient air. For example, an air gap as defined herein may contain oxygen, nitrogen, argon, neon or other gas compatible with the surrounding structures, or a gas containing a mixture of one or more such gaseous components. For one or more embodiments, the gas contained in an air gap of the present disclosure may further be below atmospheric pressure.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
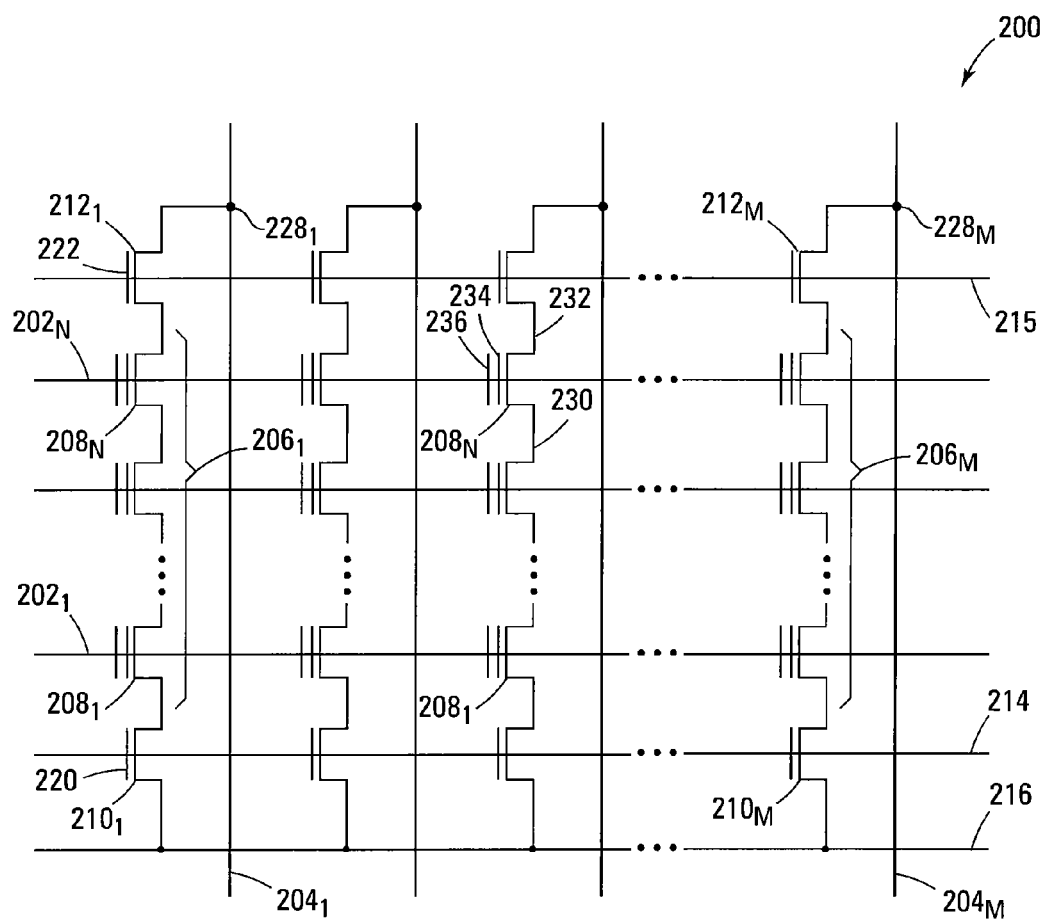
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $202_1$ to $202_N$, and intersecting local data lines, such as local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 may coupled to global data lines, such as global bit lines (not shown), in a many-to-one relationship.

Memory array 200 is arranged in rows (each corresponding to a word line 202) and columns (each corresponding to a bit line 204). Each column may include a string, such as one of NAND strings $206_1$ to $206_M$. Each NAND string 206 is coupled to a common source line 216 and includes memory cells $208_1$ to $208_N$, each located at an intersection of a word line 202 and a local bit line 204. The memory cells 208 represent non-volatile memory cells for storage of data. The memory cells 208 of each NAND string 206 are connected in series, source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 is connected to the source of the memory cell 208 of the corresponding NAND string 206. For example, the drain of source select gate $210_1$ is connected to the source of memory cell $208_1$ of the corresponding NAND string $206_1$. Therefore, each source select gate 210 selectively couples a corresponding NAND string 206 to common source line 216. A control gate 220 of each source select gate 210 is connected to source select line 214.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last memory cell $208_N$ of the corresponding NAND string 206. For example, the source of drain select gate $212_1$ is connected to the drain of memory cell $208_N$ of the corresponding NAND string $206_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the cell, and a control gate 236, as shown in FIG. 2. Memory cells 208 have their control gates 236 coupled to (and in some cases from) a word line 202. A column of the memory cells 208 is a NAND string 206 coupled to a given local bit line 204. A row of the memory cells 208 are those memory cells commonly coupled to a given word line 202.

Although the examples of FIGS. 1 and 2 were discussed in conjunction with NAND flash, the embodiments described herein are not limited to NAND flash, but can include other flash architectures, such as NOR flash, etc.

Figure 3A:
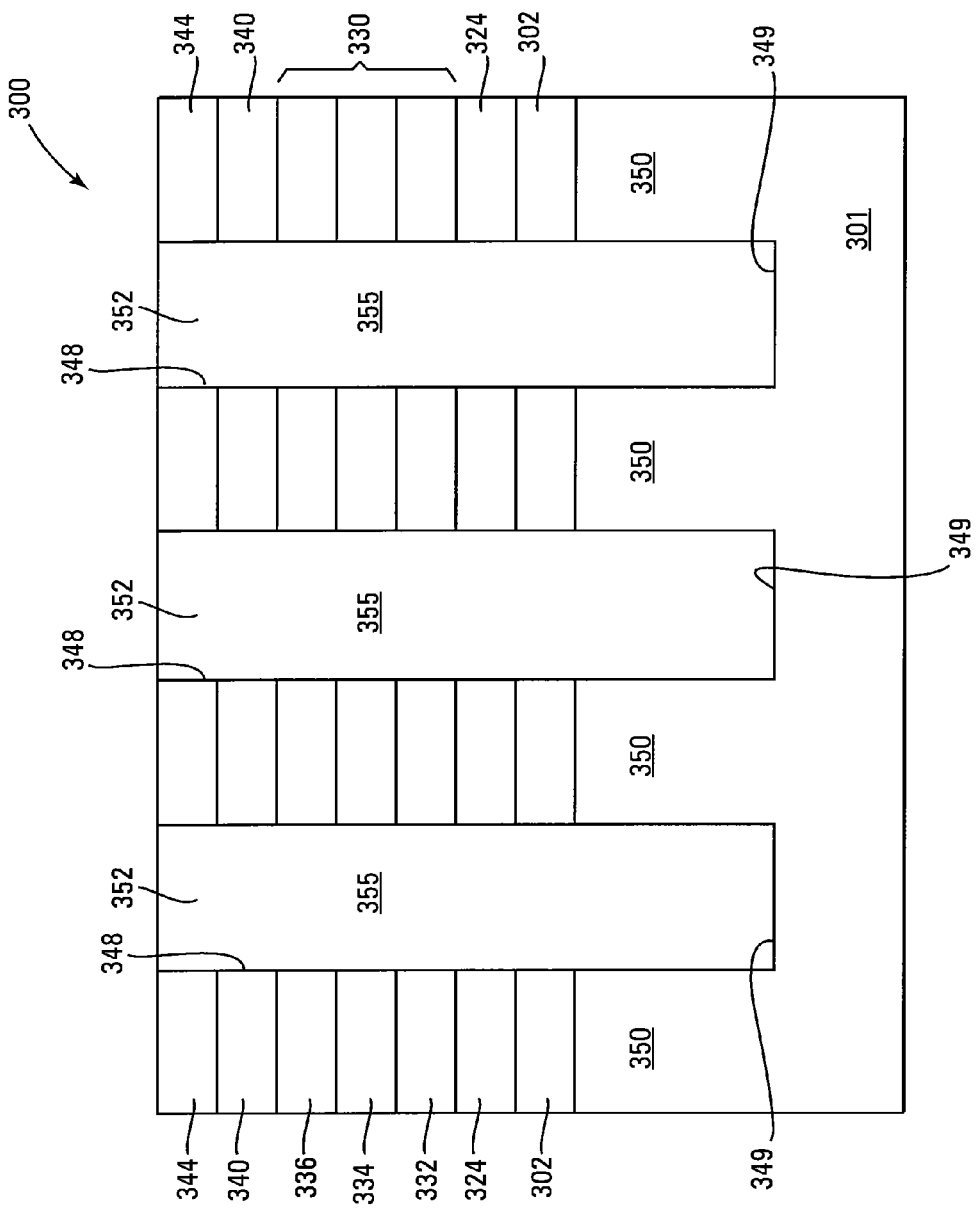
FIGS. 3A-3C are cross-sectional views of a portion of a memory array during various stages of fabrication, according to another embodiment.
Figure 3B:
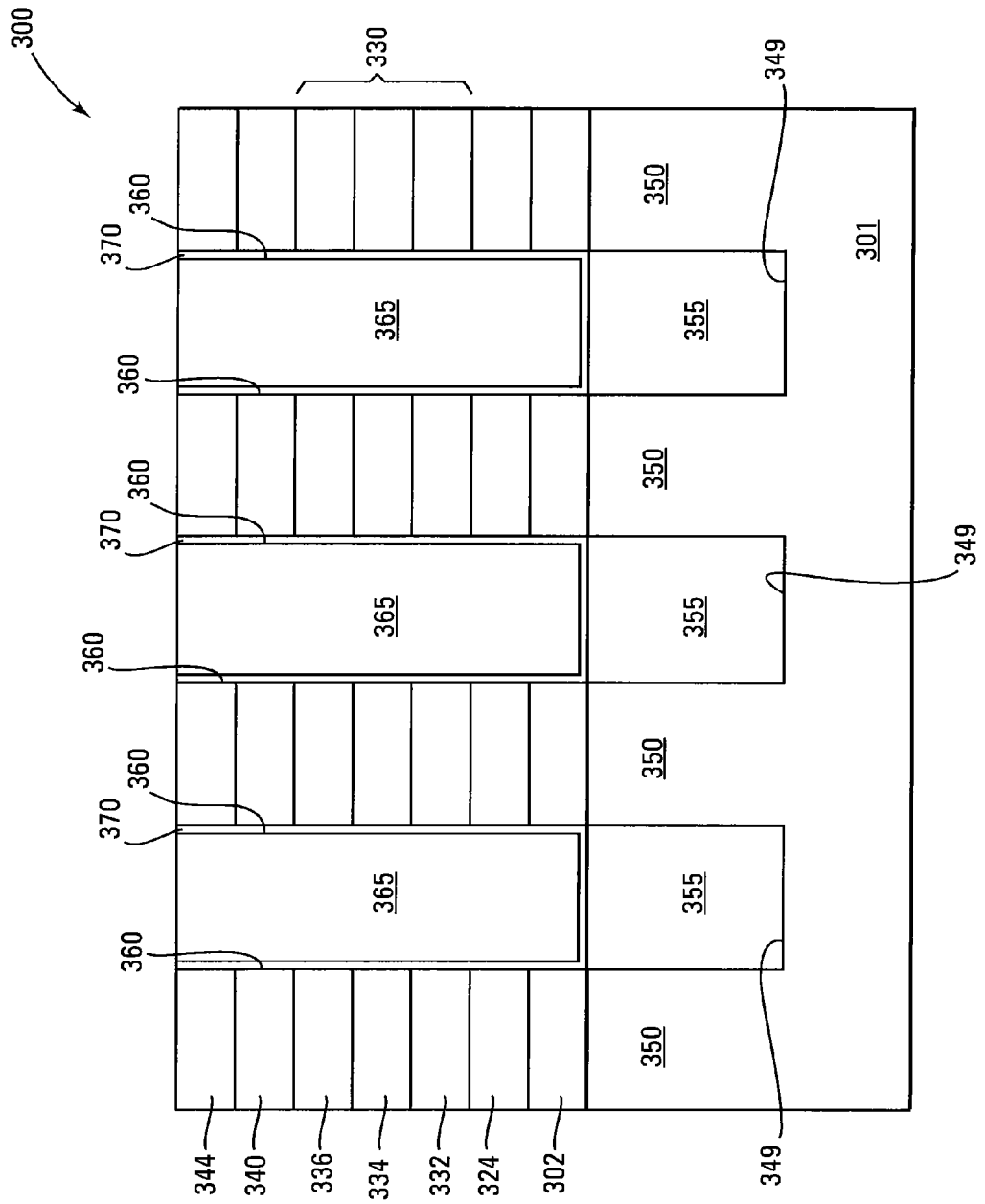
Figure 3C:
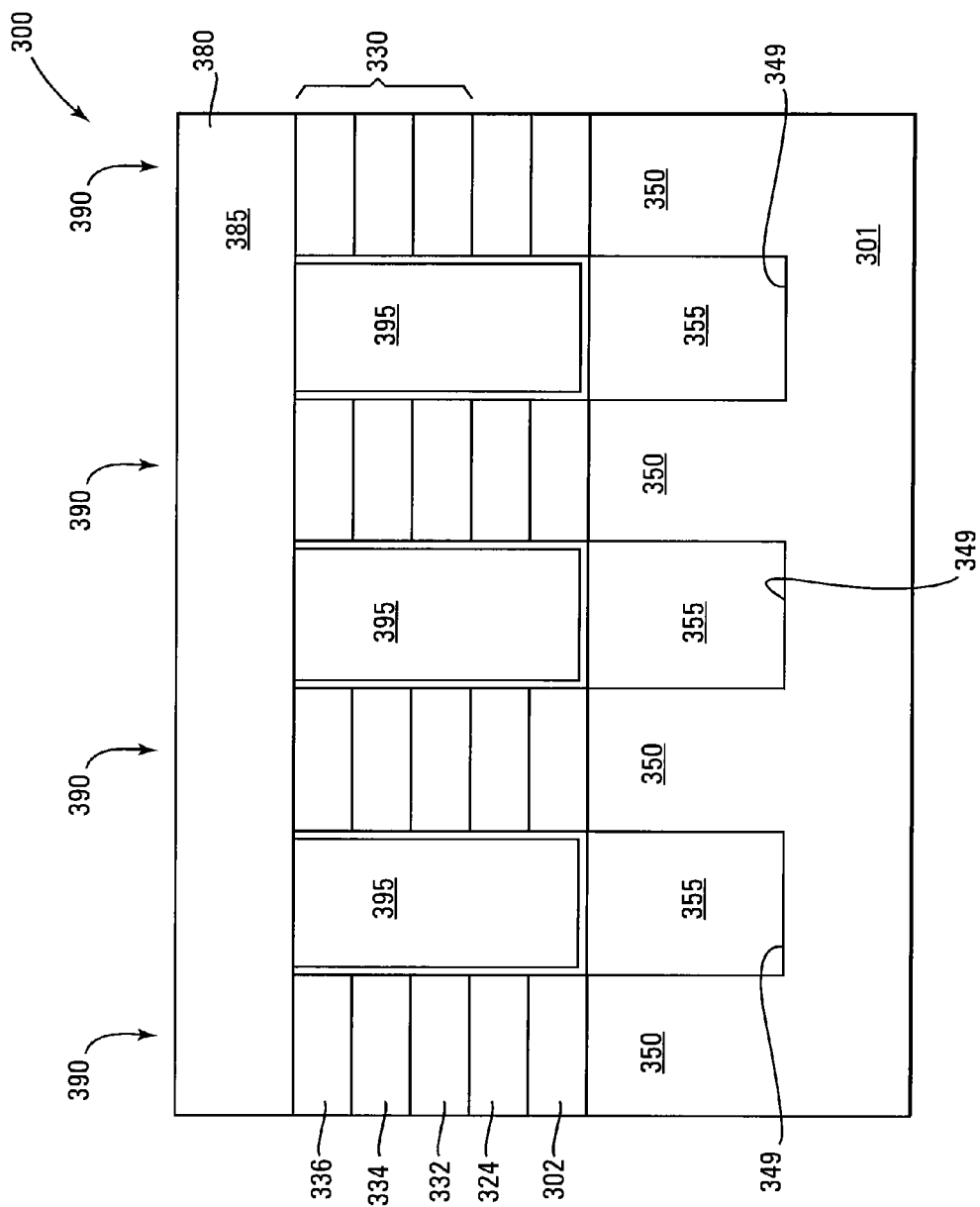

FIGS. 3A-3C are cross-sectional views of a portion of a memory array 300, such as a portion of the memory array 200 of FIG. 2, along a row direction during various stages of fabrication. Formation of the structure depicted in FIG. 3A is well understood and will not be detailed herein.

In general, for some embodiments, a dielectric 302 (e.g., a tunnel dielectric) may be formed over a semiconductor 301. Semiconductor 301 may be comprised of silicon, e.g., monocrystalline silicon, that may be conductively doped to have p-type conductivity, e.g., to form a p-well, or n-type conductivity, e.g., to form an n-well. Dielectric 302 is generally formed of one or more dielectric materials. For example, dielectric 302 may be formed from an oxide, e.g., silicon oxide, an oxynitride, e.g., silicon oxynitride, etc.

A charge-storage structure 324 may be formed over dielectric 302. Charge-storage structure 324 is generally formed of one or more materials capable of storing a charge. Charge-storage structure 324 may be a floating gate formed from a conductor. The conductor may comprise, consist of, or consist essentially of conductively doped polysilicon and/or may comprise, consist of, or consist essentially of metal, such as a refractory metal, or a metal-containing material, such as a refractory metal silicide, or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals.

For other embodiments, charge-storage structure 324 may be a charge trap. For example, the charge trap may be a dielectric, e.g., a high-dielectric-constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon-rich dielectric, or SiON/$Si_3N_4$. Other charge-storage structures are also known.

A dielectric 330 may be formed over charge-storage structure 324. Dielectric 330 is generally formed of one or more dielectric materials. For some embodiments, dielectric 330 may comprise, consist of, or consist essentially of one or more dielectrics, such as silicon oxide, nitride, oxynitride, oxide-nitride-oxide (ONO), high dielectric constant (high-K) dielectrics, such as alumina, hafnia ($HfO_2$), or zirconia ($ZrO_2$) with a K of about 20, or praeseodymium oxide ($Pr_2O_3$) with a K of about 30, or other dielectrics.

Dielectric 330 may include one or more dielectric thicknesses. In the example of FIG. 3A, dielectric 330 may include a dielectric thickness 332 formed over charge-storage structure 324; a dielectric thickness 334 formed over a dielectric thickness 332, and a dielectric thickness 336 formed over dielectric thickness 334. For example, for some embodiments, dielectric thicknesses 332, 334, and 336 may respectively be an oxide, a nitride, and an oxide, thereby forming an ONO dielectric. Alternatively, for other embodiments, each of the dielectric thicknesses 332, 334, and 336 may be high-K dielectric.

One or more sacrificial materials may be formed over dielectric 330. In the example of FIG. 3A, a sacrificial material 340, such as an oxide, e.g., silicon dioxide, may be formed over dielectric 330, e.g., over dielectric thickness 336. A sacrificial material 344, such as polysilicon, nitride etc., may then be formed over sacrificial material 340. In general, sacrificial materials 340 and 344 may be chosen to protect and/or pattern underlying layers while allowing their subsequent selective removal.

Openings 348, such as trenches, may then be formed by patterning sacrificial material 344 and removing portions of sacrificial material 340, dielectric 330, charge-storage structure 324, dielectric 302, and semiconductor 301 exposed by the patterned sacrificial material 344. For example, for some embodiments, a mask (not shown), e.g., imaging resist, such as photo-resist, may be formed over sacrificial material 344 and patterned to define regions of sacrificial material 344, sacrificial material 340, dielectric 330, charge-storage structure 324, dielectric 302, and semiconductor 301 for removal. The regions defined for removal are subsequently removed, e.g., by etching, to form openings 348 that may terminate within semiconductor 301. For example, openings 348 may expose a surface 349 of semiconductor 301 located within semiconductor 301 at a level (e.g., vertical level) below the upper surface of semiconductor 301.

Openings 348 may extend substantially in the column direction (e.g., substantially perpendicular to the face-plane of FIGS. 3A-3C). Openings 348 define active regions 350 therebetween under dielectric 302 within semiconductor 301, as shown in FIG. 3A. Each active region 350 may form a channel region for a corresponding column of memory cells, e.g., a string of series coupled memory cells, to be formed thereover. In other words, during operation of one or more memory cells of a column of memory cells, such as a string of memory cells, a channel can be formed in the corresponding active region 350.

A dielectric 352 may be deposited in openings 348, e.g., over exposed surface 349, and possibly over sacrificial material 344, such as by blanket deposition, to form isolation regions 355, e.g., shallow trench isolation (STI) regions, from dielectric 352 between the active regions 350. Dielectric 352 may then removed from sacrificial material 344, e.g., by chemical mechanical planarization (CMP), exposing an upper surface of sacrificial material 344 so that the upper surfaces of isolation regions 355 are substantially flush (e.g., flush) with the upper surface of sacrificial material 344. For example, dielectric 352 may substantially (e.g., completely) fill openings 348. Dielectric 352 is generally formed of one or more dielectric materials. For example, dielectric 352 may include an oxide, e.g., a thermal oxide and/or a high-density-plasma (HDP) oxide, or a spin-on dielectric material, e.g., hydrogen silsesquioxane (HSQ), hexamethyldisiloxane, octamethyltrisiloxane, etc.

Isolation regions 355 may be recessed by removing a portion of isolation regions 355, e.g., by etching, so that their upper surfaces may lie at a level below the level of the upper surface of dielectric 302, as shown in FIG. 3B. In other words, isolation regions 355 may be recessed to a level below the upper surface of dielectric 302. For example, the upper surfaces of the remaining portions of isolation regions 355 may lie at a level substantially at (e.g., at, above, or below) the level of the upper surface of semiconductor 301, e.g., substantially at (e.g., at, above, or below) the level of the upper surfaces of active regions 350. The remaining portions of isolation regions 355 may thus be interposed between the level of the upper surface of semiconductor 301 and the level within semiconductor 301 at which surface 349 is located (e.g., between a level below the level of the upper surface of dielectric 302 and the level within semiconductor 301 at which surface 349 is located. Note that the one or more sacrificial materials, such as sacrificial materials 340 and 344, may act as a hard mask that protects the underlying structure during the removal of the portion of isolation regions 355.

Recessing isolation regions 355 forms openings 360, such as trenches, that pass through sacrificial material 344, sacrificial material 340, dielectric 330, charge-storage structure 324, and at least a portion of dielectric 302, e.g., stopping substantially at (e.g., at, above, or below) the upper surface of semiconductor 301. A sacrificial material 365, such as nitride or oxide, may then be formed within each of the openings 360 over (e.g., on) the remaining portions of isolation regions 355 and the sides of openings 360.

For example, sacrificial material 365 may be deposited in openings 360 and possibly over sacrificial material 344, such as by blanket deposition. Sacrificial material 365 is then removed from sacrificial material 344, e.g., by chemical mechanical planarization (CMP), exposing an upper surface of sacrificial material 344 so that the upper surface of sacrificial material 365 in each opening 360 is substantially flush (e.g., flush) with the upper surface of sacrificial material 344. For example, sacrificial material may substantially (e.g., completely) fill openings 360.

For some embodiments, openings 360 may be lined with a dielectric (e.g., a dielectric liner) 370 before forming sacrificial material 365. Dielectric 370 is generally formed of one or more dielectric materials, such as an oxide, e.g., a high-density oxide. Sacrificial material 365 may then be formed within openings 360 over dielectric 370. For example, dielectric 370 may have a lower removal rate than sacrificial material 365 for a particular removal process so that sacrificial material 365 can be removed while leaving dielectric 370 within openings 360.

Sacrificial materials 340 and 344 and a portion of sacrificial material 365 are then removed in FIG. 3C, stopping on or within dielectric 330, e.g., stopping on or within dielectric thickness 336. For example, for some embodiments, upper surfaces of sacrificial material 365 may be substantially flush (e.g., flush) with an upper surface of dielectric 330, e.g., the upper surface of dielectric thickness 336. For example, the upper surfaces of sacrificial material 365 and the upper surface of dielectric 330 may be planarized, e.g., using CMP.

A conductor 380 may then be formed over dielectric 330, e.g., dielectric thickness 336, and sacrificial material 365. Conductor 380 is generally formed of one or more conductive materials. Conductor 380 may then be patterned, etched, and processed, e.g., using standard processing, to produce one or more individual access lines, such as one or more word lines 385, e.g., that may span a row of memory cells. Conductor 380 may comprise, consist of, or consist essentially of conductively doped polysilicon and/or may comprise, consist of or consist essentially of metal, such as a refractory metal, or a metal-containing material, such as a refractory metal silicide or a metal nitride, e.g., a refractory metal nitride, as well as any other conductive material.

Memory cells 390 are located over substrate 301 in the example of FIG. 3C, with each memory cell being located over an active region 350. Memory cells 390 may be located above and substantially vertically aligned (e.g., vertically aligned), on a one-to-one basis, with active regions 350, as shown in FIG. 3C. A memory cell 390 may include dielectric 302 (e.g., as a tunnel dielectric), charge-storage structure 324 over dielectric 302, dielectric 330 (e.g., dielectric thicknesses 332, 334, and 336), such as an interlayer dielectric, over charge-storage structure 324, and a control gate (e.g., as a portion of or coupled to a word line 385) over dielectric 330 (e.g., dielectric thickness 336), as shown in FIG. 3C. Note that the row memory cells 390 in the example of FIG. 3C may be commonly coupled to a single word line 385.

After forming the individual word lines 385, sacrificial material 365 may be removed to form air-containing gaps, such as air gaps 395, e.g., using an isotropic etch that is selective to sacrificial material 365. For some embodiments, sacrificial material 365 may be heated until it decomposes and is vaporized, e.g., by heating the entire structure, and then removing the vaporized sacrificial material 365. This is sometimes referred to as out-gassing. For other embodiments, sacrificial material 365 may be removed substantially concurrently with the removal, e.g., by etching, of portions of conductor 380 while forming the individual word lines.

Air gaps 395 may be located above and substantially vertically aligned (e.g., vertically aligned), on a one-to-one basis, with isolation regions 355, as shown in FIG. 3C. For example, each isolation region 355 may be interposed between a respective one of air gaps 395 and the level within semiconductor at which surface 349 is located.

It is noted that the example of FIG. 3C depicts a portion of a row of memory cells 390, such as a row 202 of FIG. 2, running substantially parallel (e.g., parallel) to the face plane of FIG. 3C. Air gaps 395 may extend substantially in the column direction, e.g., substantially perpendicular to the row direction in the example of FIG. 3C and substantially perpendicular to the face plane of FIG. 3C.

For example, each air gap 395 may span two or more rows of memory cells 390. Air gaps 395 are interposed between the memory cells 390 of successively adjacent columns of memory cells 390. For example, an air gap 395 is interposed between the charge-storage structures 324 of successively adjacent memory cells 390. Since the dielectric constant of air or other gaseous component is relatively low (e.g., 1.00059 for dry atmospheric air), the presence of an air gap between the charge-storage structures of successively adjacent memory cells reduces the capacitive coupling, and thus the parasitic capacitance, between adjacent charge-storage structures.

Air gaps 395 may also be located between the level of the upper surface of semiconductor 301, and thus the level of the upper surfaces of active regions 350, and word line 385. For example, for embodiments without dielectric liner 370, air gap 395 may extend from the level at substantially the upper surface of semiconductor 301, and thus of the upper surface of an active region 350, to word line 385, and the isolation region 355 may extend from the level of the surface 349 within the semiconductor to substantially the level of the upper surface of semiconductor 301. For embodiments, where the upper surfaces of isolation regions 355 may lie at a level below the level of the upper surface of semiconductor 301 air gaps 395 may extend below the level of the upper surface of semiconductor 301, e.g., to the upper surfaces of isolation regions 355.

Note that the memory cells 390 in the example of FIG. 3C are respectively located in different columns of memory cells respectively formed over different active regions 350. This means that air gaps 395 may be located between successively adjacent columns of memory cells 390 that are respectively located over successively adjacent active regions 350. For one embodiment, each memory cell 390 may form a portion of a respective series-coupled string of memory cells (e.g., a single NAND string 106 of FIG. 2). That is, the columns of memory cells 390 that are respectively located over successively adjacent active regions 350 may respectively include a series-coupled string of memory cells, meaning that a series-coupled string of memory cells may be located over each active region 350.

Source and drain regions, such as source 230 and a drain 232 (FIG. 2), may be formed at opposing ends of the columns of memory cells, one above the face plane of FIG. 3C and one below the face plane of FIG. 3C. For some embodiments, source/drains may be implanted in semiconductor 301 before removing sacrificial material 365, e.g., but after forming the individual word lines 385.

A conductor (not shown) that may be metal, such as aluminum, copper, etc., may be formed on a dielectric (not shown) formed over the structure of FIG. 3C. The conductor may then be patterned, etched, and processed, e.g., using standard processing, to produce individual data lines, such as bit lines 204 (FIG. 2), that are electrically connected to a column of memory cells 390, e.g., a string of series-coupled memory cells.

For some embodiments, the individual word lines 385 may be separated from each other by air gaps. That is, air gaps may be formed between successively adjacent word lines 385, e.g., in a manner similar to forming air gaps 395. The air gaps formed between successively adjacent word lines 385 may be formed after forming air gaps 395 for some embodiments.

Figure 4:
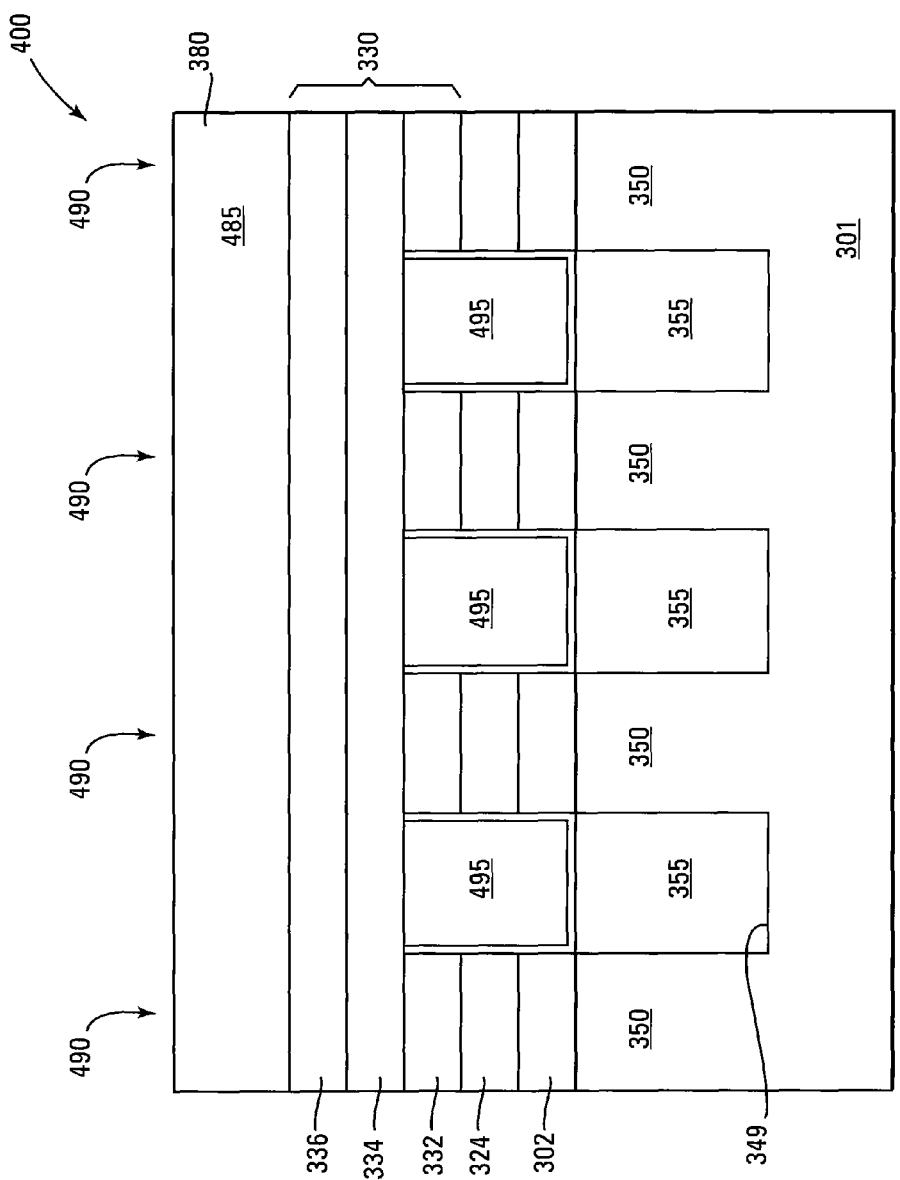
FIG. 4 is cross-sectional view of a portion of a memory array, according to another embodiment.

FIG. 4 is cross-sectional view of a portion of a memory array 400, such as a portion of the memory array 200 of FIG. 2, along a row direction, according to another embodiment. FIGS. 3C and 4 use common numbering to denote similar (e.g., the same) components. Memory array in FIG. 4 may be formed using processing similar to the processing described above in conjunction with FIGS. 3A-3C for memory array 300.

A comparison of memory arrays 300 and 400 in FIGS. 3C and 4 reveals that the air gaps 495 in memory array 400 pass through the dielectric thickness 332 and may terminate substantially at (e.g., terminate at) the upper surface of the dielectric thickness 332, whereas the air gaps 395 in memory array 300 may pass through the dielectric thicknesses 332, 334, and 336 and terminate substantially at (e.g., terminate at) the upper surface of the dielectric thickness 336. In memory array 400 of the example of FIG. 4, air gaps 495 do not pass through dielectric thicknesses 334 and 336, but instead one or more dielectric thicknesses, such as dielectric thicknesses 334 and 336, may span the length of word line 485 and are interposed between the upper surfaces of air gaps 495 and word line 485.

Air gaps 495 may also be located between the level of the upper surface of semiconductor 301, and thus the level of the upper surfaces of active regions 350, and dielectric thickness 334. For example, for embodiments without dielectric liner 370, air gap 495 may extend from the level at substantially the upper surface of semiconductor 301, and thus of the upper surface of an active region 350, to dielectric thickness 334 and the isolation region 355 may extend from the level of the surface 349 within the semiconductor 301 to substantially the level of the upper surface of semiconductor 301.

Formation of memory array 400 may proceed as shown in the example of FIG. 3A for memory array 300, except that sacrificial materials 340 and 344 may replace dielectric thicknesses 334 and 336. For example, sacrificial material 340 may be formed over dielectric thickness 332 and sacrificial material 344 would then be formed over sacrificial material 340.

The structure shown in the example of FIG. 3B for memory array 300 would differ for memory array 400, in that dielectric thicknesses 334 and 336 may be omitted. Memory array 400 in FIG. 4 may be formed from the structure of FIG. 3B, with dielectric thicknesses 334 and 336 omitted, by removing sacrificial materials 340 and 344 and a portion of sacrificial material 365, stopping on or within dielectric thickness 332. For example, for some embodiments, upper surfaces of sacrificial material 365 may be substantially flush (e.g., flush) with an upper surface of dielectric thickness 332. For example, the upper surfaces of sacrificial material 365 and the upper surface of dielectric 332 may be planarized, e.g., using CMP.

Dielectric thickness 334 may then be formed over the upper surfaces of sacrificial material 365 and the upper surface of dielectric 332, and dielectric thickness 336 may then be formed over dielectric thickness 334, as shown in FIG. 4. Conductor 380 may then be formed over dielectric thickness 336 and individual word lines, such as word line 485, may then be formed from conductor 380, e.g., in a manner substantially similar to (e.g., in the same manner as) that described above for word line 385 in conjunction with FIG. 3C. Air gaps 495 may then be formed by removing sacrificial material 365, e.g., in a manner substantially similar to (e.g., in the same manner as) that described above for air gaps 395 in conjunction with FIG. 3C.

Memory cells 490 are located over substrate 301 in the example of FIG. 4, where each memory cell 490 is located over an active region 350. For example, a memory cell 490 may include dielectric 302 (e.g., as a tunnel dielectric), charge-storage structure 324 over dielectric 302, dielectric thickness 332 over charge-storage structure 324, dielectric thickness 334 over dielectric thickness 332 and dielectric thickness 336 over dielectric thickness 334, and a control gate (e.g., as a portion of or coupled to a word line 485) over dielectric thickness 336, as shown in FIG. 4. Note that dielectric thicknesses 334 and 336 may be common contiguous layers for the row memory cells 490. Dielectric thicknesses 332, 334, and 336 may form an interlayer dielectric interposed between the charge-storage structures 324 and word line 485. Note that the row memory cells 490 in the example of FIG. 4 may be commonly coupled to a single word line 485.

It is noted that FIGS. 3A-3C and FIG. 4 can depict either a NAND-type memory array, such as memory array 200 in FIG. 2, or NOR-type memory array, with the differences occurring in the column direction in manners that are well understood in the art of memory fabrication.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. A method of forming a memory array, comprising:
    forming a dielectric over a semiconductor;
    forming a charge-storage structure over the dielectric;
    forming an isolation region through the dielectric and the charge-storage structure and extending into the semiconductor;

recessing the isolation region to a level below a level of an upper surface of the dielectric and at or above a level of an upper surface of the semiconductor;

forming an access line over the charge-storage structure and the recessed isolation region; and forming an air gap over the recessed isolation region so that the air gap passes through the charge-storage structure, so that the air gap extends to and terminates at a bottom surface of the access line, and so that the entire air gap is between the bottom surface of the access line and the upper surface of the semiconductor.

2. The method of claim 1, wherein the dielectric is a first dielectric, and further comprising forming a second dielectric over the charge-storage structure before forming the isolation region and the access line.

3. The method of claim 2, wherein the second dielectric comprises one or more dielectric materials.

4. The method of claim 2, further comprising:
forming a third dielectric over the second dielectric before forming the access line; and
forming the access line over the third dielectric before removing the sacrificial material to form the air gap.

5. The method of claim 1, wherein forming the air gap comprises:
forming sacrificial material over the recessed isolation region where the air gap is to be formed, before forming the access line; and
removing the sacrificial material to form the air gap after forming the access line.

6. The method of claim 5, wherein removing the sacrificial material comprises out-gassing or etching.

7. The method of claim 1, wherein the air gap extends in a direction that is substantially perpendicular to a direction in which the access line extends.

8. The method of claim 1, wherein the air gap contains one or more gaseous components, wherein the one or more gaseous components comprise one or more gaseous components selected from the group consisting of ambient air, oxygen, nitrogen, argon, neon, gases inert to structures surrounding the air gap, and one or more gaseous components below atmospheric pressure.

9. A method of forming a memory array, comprising:
forming a first dielectric over a semiconductor;
forming a charge-storage structure over the first dielectric;
forming a second dielectric over the charge-storage structure;
forming an isolation region through the second dielectric, the charge-storage structure, and the first dielectric, and extending into the semiconductor;
removing a portion of the isolation region to form an opening that terminates at a remaining portion of the isolation region and that passes through the second dielectric, the charge-storage structure, and at least a portion of the first dielectric;
forming sacrificial material within the opening over the remaining portion of the isolation region;
forming a conductor over the second dielectric and the sacrificial material;
removing the sacrificial material from the opening to form an air gap over the remaining portion of the isolation region so that the air gap passes through the second dielectric, the charge-storage structure, and at least a portion of the first dielectric, so that the air gap extends to and terminates at a bottom surface of the conductor, and so that the entire air gap is between the bottom surface of the conductor and an upper surface of the semiconductor.

10. The method of claim 9, further comprising forming access lines from the conductor before removing the sacrificial material from the opening to form the air gap.

11. The method of claim 10, further comprising forming other air gaps between adjacent access lines.

12. The method of claim 10, wherein removing the sacrificial material from the opening to form the air gap comprises an isotropic etch that is selective to the sacrificial material.

13. The method of claim 9, further comprising forming access lines from the conductor substantially concurrently with removing the sacrificial material from the opening to form the air gap.

14. The method of claim 9, wherein the sacrificial material is first sacrificial material, and further comprising:
forming second sacrificial material over the second dielectric before forming the isolation region; and
removing the second sacrificial material after forming the first sacrificial material within the opening, but before forming conductor over the second dielectric.

15. The method of claim 9, further comprising:
forming a third dielectric over the second dielectric before forming the conductor; and
forming the conductor over the third dielectric.

16. The method of claim 15, wherein the third dielectric comprises one or more dielectric thicknesses.

17. The method of claim 9, further comprising:
lining the opening with a third dielectric; and
forming the sacrificial material within the lined opening over the remaining portion of the isolation region and the third dielectric.

18. The method of claim 17, wherein forming a conductor further comprises forming the conductor so that ends of the third dielectric contact the conductor.

19. The method of claim 17, wherein removing the sacrificial material from the opening to form an air gap comprises removing the sacrificial material from the lined opening so that the air gap extends between opposing sides of the third dielectric.

20. A method of forming a memory array, comprising:
forming a tunnel dielectric over a semiconductor;
forming a charge-storage structure over the tunnel dielectric;
forming at least a portion of an interlayer dielectric over the charge-storage structure;
forming a first opening through the at least the portion of the interlayer dielectric, the charge-storage structure, and the tunnel dielectric, and extending into the semiconductor to a level within the semiconductor;
forming an other dielectric within the first opening;
removing a portion of the other dielectric from the first opening to form a second opening that terminates at a level of or above an upper surface of the semiconductor so that a remaining portion of the other dielectric extends from the level of or above the upper surface of the semiconductor to the level within the semiconductor, the second opening passing through the at least the portion of the interlayer dielectric, the charge-storage structure, and the tunnel dielectric;
forming sacrificial material within the second opening over the remaining portion of the other dielectric;
forming a control gate over the at least the portion of the interlayer dielectric and the sacrificial material;
after forming the control gate, removing the sacrificial material from the second opening to form an air gap over the remaining portion of the other dielectric so that the air gap passes through the at least the portion of the interlayer dielectric, the charge-storage structure, and at least a portion of the tunnel dielectric, so that the air gap extends to and terminates at a bottom surface of the control gate, and so that the entire air gap is between the bottom surface of the control gate and the upper surface of the semiconductor.

21. The method of claim 20, further comprising lining the second opening with a dielectric liner before forming sacrificial material within the second opening.

22. The method of claim 21, wherein forming sacrificial material within the second opening comprises forming the sacrificial material over the dielectric liner.

23. The method of claim 22, wherein removing the sacrificial material from the second opening to form the air gap comprises removing the sacrificial material from the dielectric liner so that air gap extends between opposing surfaces of the dielectric liner.

24. The method of claim 22, wherein forming the control gate further comprises forming the control gate so that ends of the dielectric liner contact the dielectric liner.

* * * * *